US011852650B2

(12) United States Patent
Rizzini et al.

(10) Patent No.: US 11,852,650 B2
(45) Date of Patent: Dec. 26, 2023

(54) DUAL-OPERATING ACCELEROMETER

(71) Applicant: STMICROELECTRONICS S.r.l., Agrate Brianza (IT)

(72) Inventors: Francesco Rizzini, Passirano (IT); Nicolo' Manca, Turin (IT); Cristian Dall'Oglio, Niscemi (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 79 days.

(21) Appl. No.: 17/675,501

(22) Filed: Feb. 18, 2022

(65) Prior Publication Data

US 2023/0266356 A1    Aug. 24, 2023

(51) Int. Cl.
| | | |
|---|---|---|
| *G01P 15/125* | (2006.01) | |
| *B81B 7/02* | (2006.01) | |
| *G01P 15/08* | (2006.01) | |
| *G01P 15/18* | (2013.01) | |

(52) U.S. Cl.
CPC ............. *G01P 15/125* (2013.01); *B81B 7/02* (2013.01); *G01P 15/18* (2013.01); *B81B 2201/0235* (2013.01); *G01P 2015/082* (2013.01)

(58) Field of Classification Search
CPC ..................................................... G01P 15/125
USPC ...................................................... 73/514.32
See application file for complete search history.

(56) References Cited

U.S. PATENT DOCUMENTS

| | | | |
|---|---|---|---|
| 8,320,578 B2 | 11/2012 | Kahn et al. | |
| 9,363,596 B2 | 6/2016 | Dusan et al. | |
| 9,532,131 B2 | 12/2016 | Dusan et al. | |
| 2004/0226377 A1* | 11/2004 | Tsugai | G01C 19/5719 73/514.32 |
| 2011/0023604 A1 | 2/2011 | Cazzaniga et al. | |
| 2011/0030472 A1* | 2/2011 | Aziz | G01P 15/0802 216/13 |
| 2020/0400712 A1 | 12/2020 | Gattere et al. | |
| 2021/0190814 A1 | 6/2021 | Darmanin et al. | |

OTHER PUBLICATIONS

Dwivedi et al., "Variation of Sensitivity of a MEMS Capacitive Accelerometer Based Microphone with Suspension System Topology," IntechOpen, Hearing Loss—From Multidisciplinary Teamwork to Public Health:2021, 19 pages.

Mohammed et al., "Monolithic Multi Degree of Freedom (MDoF) Capacitive MEMS Accelerometers," Micromachines 9(602):1-20, 2018.

(Continued)

Primary Examiner — Walter L Lindsay, Jr.
Assistant Examiner — Philip T Fadul
(74) Attorney, Agent, or Firm — SEED IP LAW GROUP LLP

(57) ABSTRACT

The present disclosure is directed to micro-electromechanical system (MEMS) accelerometers that are configured for a user interface mode and a true wireless stereo (TWS) mode of an audio device. The accelerometers are fabricated with specific electromechanical parameters, such as mass, stiffness, active capacitance, and bonding pressure. As a result of the specific electromechanical parameters, the accelerometers have a resonance frequency, quality factor, sensitivity, and Brownian noise density that are suitable for both the user interface mode and the TWS mode.

20 Claims, 4 Drawing Sheets

(56) References Cited

OTHER PUBLICATIONS

NXP Freescale Semiconductor, "3-Axis Orientation/Motion Detection Sensor," Sensors, Document No. MMA7660FC, Rev. 8, Mar. 2012, 35 pages.

Peterson, "Exploring accelerometers as a user interface in a bone conduction sound processor," Master's Thesis, Chalmers University of Technology, Department of Electrical Engineering, Gothenburg, Sweden, 2018, 58 pages.

* cited by examiner

DUAL-OPERATING ACCELEROMETER

BACKGROUND

TECHNICAL FIELD

The present disclosure is directed to micro-electromechanical system (MEMS) accelerometers.

DESCRIPTION OF THE RELATED ART

Micro-electromechanical system (MEMS) accelerometers may be used for a large variety of applications, and are often specifically designed for its application. For example, accelerometers for user interface applications (e.g., touch detection) are generally designed to detect low acceleration levels and have high sensitivity, in order to detect small movements of an electronic device. In contrast, accelerometers for fall and drop detection are generally designed to detect high acceleration levels and have low sensitivity, in order to not saturate front-end electronic components.

With the exponential increase of possible applications of accelerometers, there is an increased demand for measuring acceleration in large and varied ranges in a single electronic device. As a result, many electronic devices include multiple, different accelerometers (e.g., both an accelerometer to detect low acceleration levels and an accelerometer to detect high acceleration levels) in order to detect multiple ranges of accelerations. However, including multiple accelerometers in a single device is not ideal as adding additional accelerometers increases complexity of the circuitry, lowers portability of the device, and adds to manufacturing costs. Thus, it is desirable for a single accelerometer that is capable of measuring acceleration in multiple different ranges.

BRIEF SUMMARY

The present disclosure is directed to micro-electromechanical system (MEMS) accelerometers with a large bandwidth, low product noise density, and high signal accuracy. The accelerometers are able to operate in two different operating modes for an audio device: a user interface mode and a true wireless stereo (TWS). In the user interface mode, the accelerometers are used to detect an input from a user, such as a user's touch. In the TWS mode, the accelerometers are used to detect a user's voice or a spoken word.

The accelerometers are fabricated with custom electromechanical parameters to achieve the large bandwidth, the low product noise density, and the high signal accuracy. For example, the accelerometers utilize sensing masses, springs, and electrodes with precise specifications to attain specific masses of the sensing masses, stiffness of the springs, and active capacitance of the electrodes. As a result of the custom electromechanical parameters, the accelerometers are able to achieve a resonance frequency, quality factor, sensitivity, and Brownian noise density that are suitable for both the user interface mode and the TWS mode.

BRIEF DESCRIPTION OF THE SEVERAL VIEWS OF THE DRAWINGS

In the drawings, identical reference numbers identify similar features or elements. The size and relative positions of features in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of manufacturing electronic components and accelerometers have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

As discussed above, the exponential increase of possible applications of micro-electromechanical system (MEMS) accelerometers has introduced the desire of an accelerometer that measures acceleration in large and varied ranges, and is not limited to a specific acceleration range of a particular application.

The present disclosure is directed to a MEMS accelerometer that concurrently addresses specifications for two different operating modes for an audio device: a user interface mode and a true wireless stereo (TWS) mode.

In the user interface mode, the accelerometer is used to detect an input from a user, such as a user's touch and a single and a double tap. In order to distinguish between random movements of the device and an input from the user, the accelerometer should have a high level of signal accuracy.

In the TWS mode, the accelerometer is used for bone conduction functionality, which involves measuring bone vibration signals propagating through the human body (e.g., bone and tissue vibrations through the jaw or ear canal) to detect a user's voice. The accelerometer should have a wide signal bandwidth to measure bone vibration signals of different words spoken by a user.

Figure 1:
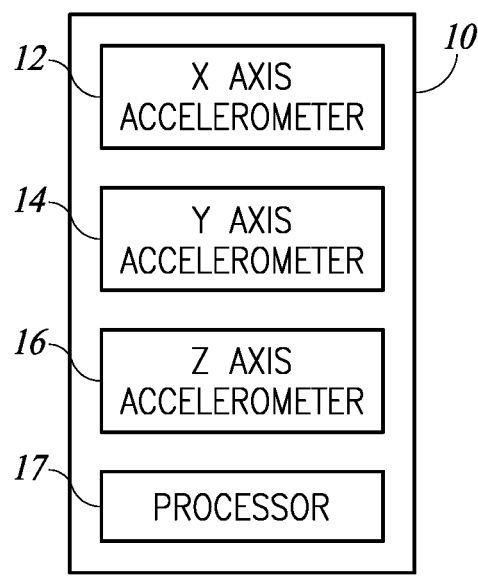
FIG. 1 is a block diagram of a device according to an embodiment disclosed herein.

FIG. 1 is a block diagram of a device 10 according to an embodiment disclosed herein. The device 10 is an electronic device configured to operate in the user interface mode and the TWS mode. In one embodiment, the device 10 is an audio device, such as an audio headset, earphones, and earbuds. In this embodiment, the device 10 includes a speaker that produces sound (e.g., music, a phone call, etc.), and a microphone for receiving sound (e.g., a user's voice).

The device 10 includes an X axis accelerometer 12, a Y axis accelerometer 14, a Z axis accelerometer 16, and a processor 17.

Each of the X axis accelerometer 12, the Y axis accelerometer 14, and the Z axis accelerometer 16 is a MEMS accelerometer. The X axis accelerometer 12 measures acceleration along an X axis, the Y axis accelerometer 14 measures acceleration along a Y axis, and the Z axis accelerometer 16 measures acceleration along the Z axis. The X axis and the Y axis are orthogonal to each other and in the same plane. The Z axis is orthogonal to the X axis and the Y axis.

The X axis accelerometer 12, the Y axis accelerometer 14, and the Z axis accelerometer 16 are positioned on the same supporting substrate. For example, the X axis accelerometer 12, the Y axis accelerometer 14, and the Z axis accelerometer 16 may be fabricated in the same semiconductor substrate, or mounted on the same printed circuit board.

The processor 17 receives and processes acceleration measurements from the X axis accelerometer 12, the Y axis accelerometer 14, and the Z axis accelerometer 16. In the user interface mode, the processor 17 detects an input from a user, such as a user's touch and a single and a double tap, based on the received accelerations measurements from the X axis accelerometer 12, the Y axis accelerometer 14, and the Z axis accelerometer 16. In the TWS mode, the processor 17 detects a user's voice or a spoken word based on the received accelerations measurements from the X axis accelerometer 12, the Y axis accelerometer 14, and the Z axis accelerometer 16. The processor 17 may be any type of microprocessor or controller configured to process data.

Each of the X axis accelerometer 12 and the Y axis accelerometer 14 utilizes a single silicon layer micro-machined element. Namely, each of the X axis accelerometer 12 and the Y axis accelerometer 14 includes a single movable sensing structure with a set of folded springs that allows movement of the sensing structure along the sensing axis (e.g., the X or Y axis). The sensing structure features a semi-mushroom architecture, and a set of parallel plate cells for sensing. An interdigitated stators configuration is also adopted, coupled with a non-symmetric placement of the different stators along orthogonal axis direction. This design of the sensing structure is optimized for substrate deformation rejection.

Figure 2:
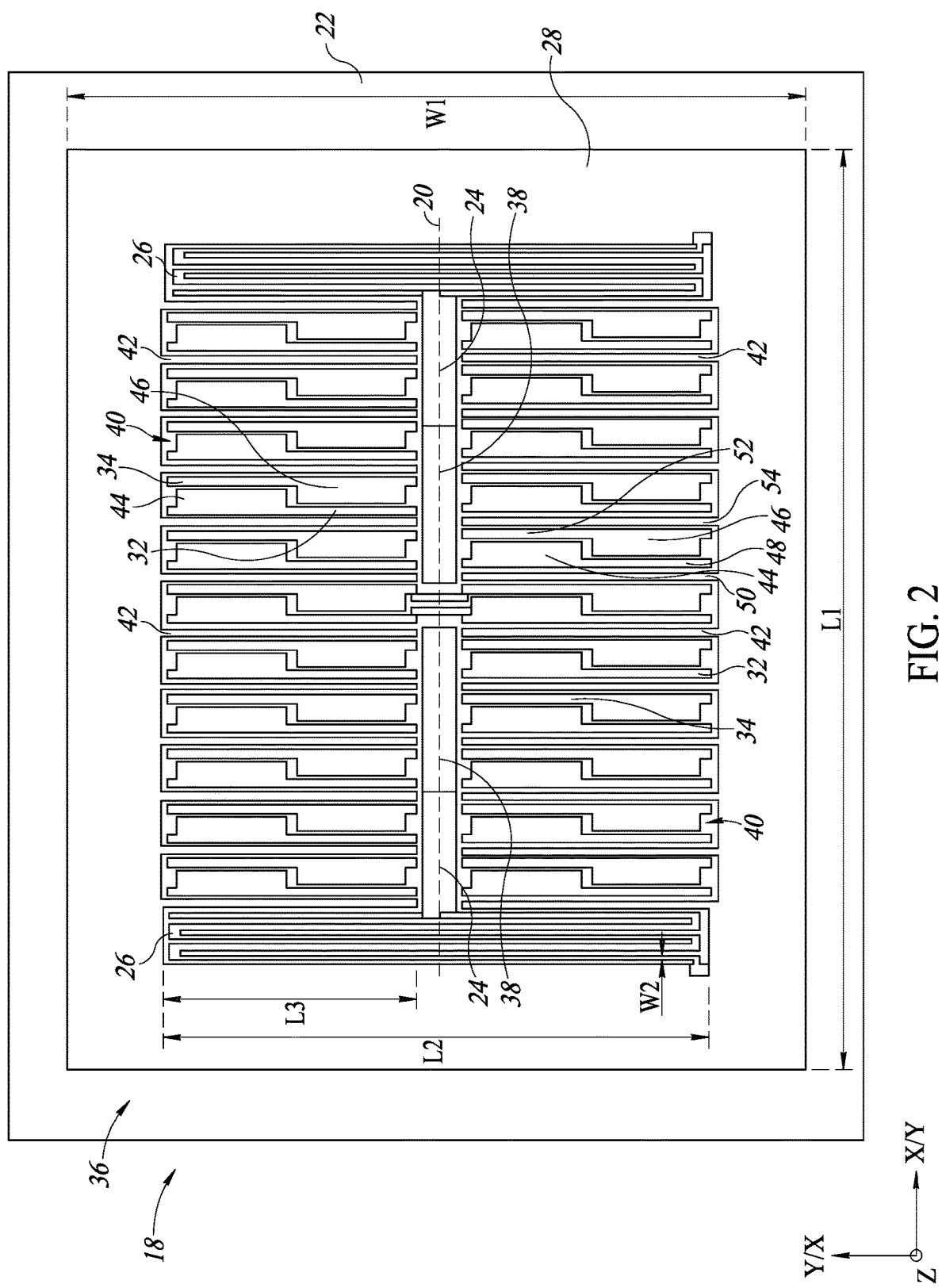
FIG. 2 is a plan view of an accelerometer according to an embodiment disclosed herein.

For example, FIG. 2 is a plan view of an accelerometer 18 according to an embodiment disclosed herein. In FIG. 2, the X axis and the Y axis are orthogonal to each other and in the same plane. The Z axis is orthogonal to the X axis and the Y axis.

The accelerometer 18 may be used as each of the X axis accelerometer 12 and the Y axis accelerometer 14. In a case where the accelerometer 18 is the X axis accelerometer 12, a sensing axis 20 of the accelerometer 18 extends along the X axis and is orthogonal to the Y axis. Conversely, in a case where the accelerometer 18 is the Y axis accelerometer 14, the sensing axis 20 of the accelerometer 18 extends along the Y axis and is orthogonal to the X axis.

The accelerometer 18 includes a substrate 22, transverse arms 24, spring elements 26, a sensing mass 28, first electrodes 32, and second electrodes 34.

The transverse arms 24 directly overlie and are spaced from a surface 36 of the substrate 22. In the case where the accelerometer 18 is the X axis accelerometer 12, a length of each of the transverse arms 24 extend along the X axis. In the case where the accelerometer 18 is the Y axis accelerometer 14, a length of each of the transverse arms 24 extend along the Y axis.

The transverse arms are physically coupled to the surface 36 of the substrate 22 by arm anchoring portions 38. In the case where the accelerometer 18 is the X axis accelerometer 12, the transverse arms 24 and the anchoring portions 38 are aligned with each other along the X axis. In the case where the accelerometer 18 is the Y axis accelerometer 14, the transverse arms 24 and the anchoring portions 38 are aligned with each other along the Y axis. The arm anchoring portions 38 are rigid structures that are physically coupled to the surface 36 of the substrate 22. As such, the transverse arms 24 and the arm anchoring portions 38 are in fixed positions relative to the substrate 22.

The spring elements 26 directly overlie and are spaced from the surface 36 of the substrate 22. Each of the spring elements 26 is physically coupled to a respective transverse arm 24 and the sensing mass 28. In the case where the accelerometer 18 is the X axis accelerometer 12, a length of each of the spring elements 26 extend along the Y axis. In the case where the accelerometer 18 is the Y axis accelerometer 14, a length of each of the spring elements 26 extend along the X axis. The spring elements 26 are configured to allow a displacement or translation of the sensing mass 28 along the sensing axis 20 in response to an external acceleration having a component parallel to the sensing axis 20. In one embodiment, as shown in FIG. 2, the spring elements 26 are folded type springs with a plurality of folds in a serpentine shape in the plan view.

The sensing mass 28 directly overlies and is spaced from the surface 36 of the substrate 22. The sensing mass 28 is physically coupled to the spring elements 26. The sensing mass 28 is a mass of conductive material, such as semiconductor material. As discussed above, the spring elements 26 allow the sensing mass 28 to move along the sensing axis 20 in response to an external acceleration having a component parallel to the sensing axis 20. The sensing mass 28 includes an opening 40 and intermediate arms 42.

The opening 40 is a through hole that extends though the sensing mass 28. The transverse arms 24, the spring elements 26, the first electrodes 32, and the second electrodes 34 are positioned in the opening 40 and spaced away from a sidewall of the opening 40.

The intermediate arms 42 extend from the sensing mass 28 and into the opening 40. Stated differently, the intermediate arms 42 extend from the sidewall of the opening 40 and towards the transverse arms 24. As shown in FIG. 2, a first plurality of the intermediate arms 42 are spaced from a second plurality of the intermediate arms 42 by the transverse arms 24. A length of each of the intermediate arms 42 extends in a direction transverse to the sensing axis 20. A single first electrode 32 and a single second electrode 34 are positioned between two immediately adjacent intermediate arms 42.

The first electrodes 32 and the second electrodes 34 directly overlie and are spaced from a surface 36 of the substrate 22. In the case where the accelerometer 18 is the X axis accelerometer 12, a length of each of the first electrodes 32 and the second electrodes 34 extend along the Y axis. In the case where the accelerometer 18 is the Y axis accelerometer 14, a length of each of the first electrodes 32 and the second electrodes 34 extend along the X axis. In one embodiment, as shown in FIG. 2, the first electrodes 32 and the second electrodes 34 are rectangular in shape in the plan view. The first electrodes 32 and the second electrodes 34 are made of conductive material, such as doped silicon.

The first electrodes 32 and the second electrodes 34 are physically coupled to the surface 36 of the substrate 22 by first electrode anchoring portions 44 and second electrode anchoring portions 46, respectively. Each of the first electrodes 32 is aligned with and physically coupled to a respective first electrode anchoring portions 44, and each of the second electrodes 34 is aligned with and physically coupled to a respective second electrode anchoring portions 46. The first electrode anchoring portions 44 and the second electrode anchoring portions 46 are rigid structures that are physically coupled to the surface 36 of the substrate 22. As such, the first electrodes 32, the second electrodes 34, the first electrode anchoring portions 44, and the second electrode anchoring portions 46 are in fixed positions relative to the substrate 22.

During operation, the sensing mass 28, the first electrodes 32, and the second electrodes 34 are biased at respective biasing voltages. As a result, each of the first electrodes 32 is capacitively coupled to an adjacent intermediate arm 42, and each of the second electrodes 34 is capacitively coupled to an adjacent intermediate arm 42. For example, referring to FIG. 2, the electrode 48 of the first electrodes 32 is capacitively coupled to the arm 50 of the intermediate arms 42, and the electrode 52 of the second electrodes 34 is capacitively coupled to the arm 54 of the intermediate arms 42.

In the rest condition (i.e., when no external acceleration is applied to the accelerometer 18), distances between the first electrodes 32 and the intermediate arms 42 are equal to distances between the second electrodes 34 and the intermediate arms 42. As a result, capacitances between the first electrodes 32 and the intermediate arms 42 are equal to capacitances between the second electrodes 34 and the intermediate arms 42.

In response to an external acceleration being applied to the accelerometer 18, the sensing mass 28, including the intermediate arms 42, move along the sensing axis 20. As a result, distances between the first electrodes 32 and the intermediate arms 42 are no longer equal to distances between the second electrodes 34 and the intermediate arms 42, and, thus, capacitances between the first electrodes 32 and the intermediate arms 42 are no longer equal to capacitances between the second electrodes 34 and the intermediate arms 42. Acceleration is measured based on the variations of the capacitances between the first electrodes 32 and the intermediate arms 42, and the capacitances between the second electrodes 34 and the intermediate arms 42.

The Z axis accelerometer 16 also utilizes a single silicon layer micro-machined element. Namely, the Z axis accelerometer 16 includes a single movable sensing structure with a set of torsional springs that allow tilting of the sensing structure along the Z axis. The sensing structure features a 4 anchors architecture in which anchor points are placed in a distributed fashion and are surrounded by electrodes. This design of the sensing structure allows for the reduction of the absolute difference in the gap between out-of-plane stators and rotors, and is optimized for substrate deformation rejection.

Figure 3:
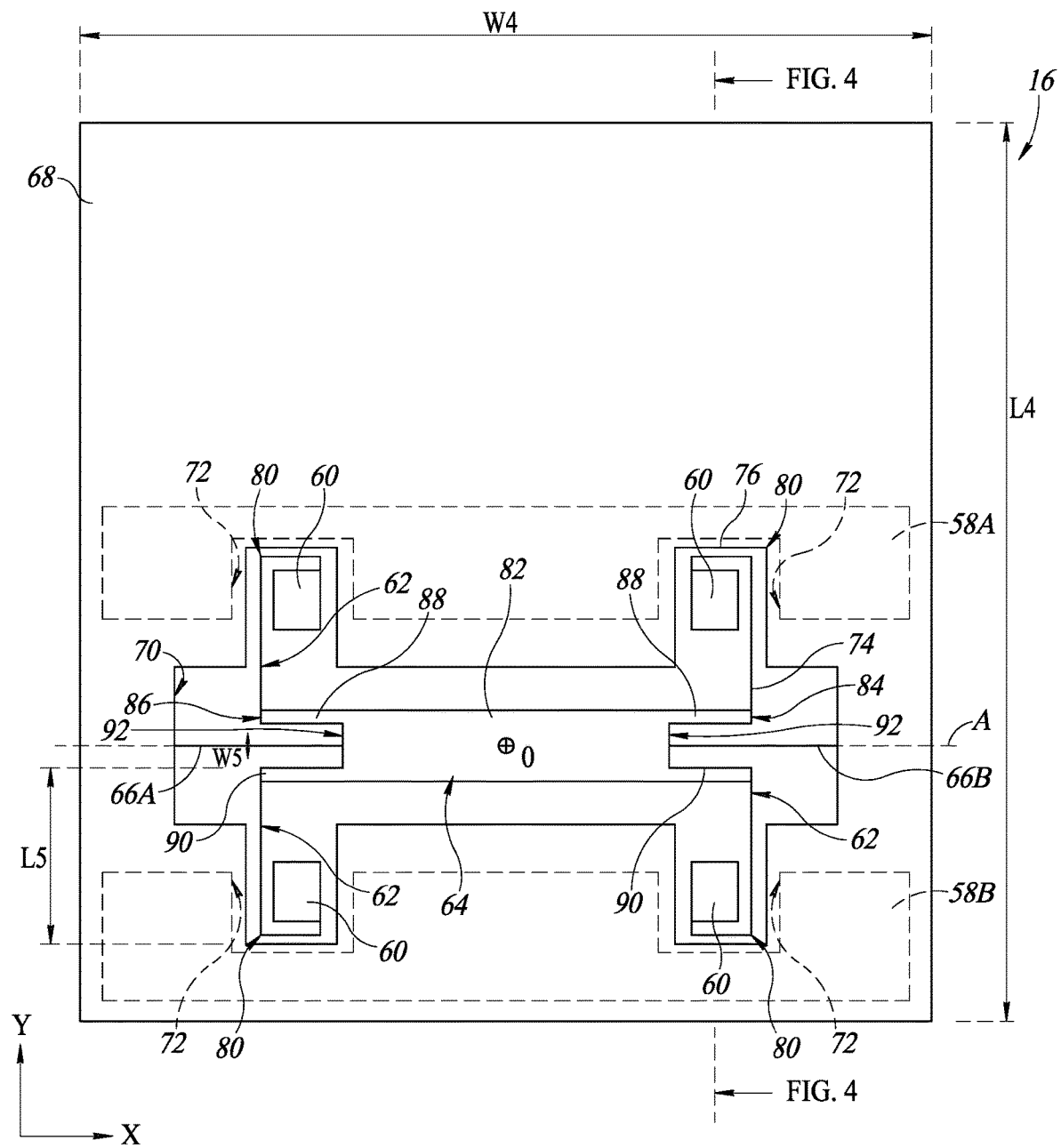
FIG. 3 is a plan view of a Z axis accelerometer according to an embodiment disclosed herein.
Figure 4:
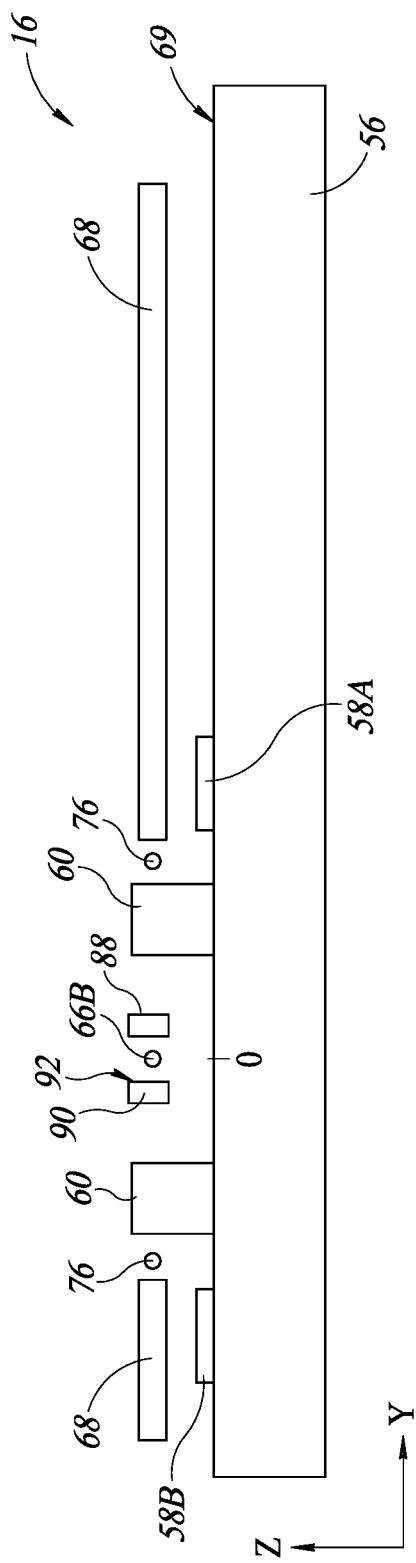
FIG. 4 is a cross-sectional view of the Z axis accelerometer in FIG. 3 according to an embodiment disclosed herein.

For example, FIG. 3 is a plan view of the Z axis accelerometer 16 according to an embodiment disclosed herein. FIG. 4 is a cross-sectional view of the Z axis accelerometer 16 according to an embodiment disclosed herein. The cross-sectional view in FIG. 4 is taken along the axis shown in FIG. 3. It is beneficial to review FIGS. 3 and 4 together.

The Z axis accelerometer 16 includes a substrate 56, fixed electrodes 58A and 58B, anchoring elements 60, supporting elastic element 62, a coupling mass 64, connection elastic elements 66A and 66B, and a sensing mass 68. In one embodiment, the substrate 56 and the substrate 22 are the same substrate.

The fixed electrodes 58A and 58B are on a surface 69 of the substrate 56. As best shown in FIG. 3, the fixed electrodes 58A and 58B are positioned on opposite sides of an opening 70 of the sensing mass 68, and directly underlie the sensing mass 68. As will be discussed in further detail below, the opening 70 is a through hole that extends though the sensing mass 68. The fixed electrodes 58A and 58B are made of a conductive material, such as doped silicon.

Each of the fixed electrodes 58A and 58B are rectangular in shape in the plan view with a length extending along the X axis, and include recesses 72. Each of the recesses 72 surround a respective anchoring element 60. Similar recesses, corresponding to recesses 72, are provided within the sensing mass 68, opening out towards the opening 70 and joined thereto.

The anchoring elements 60 are rigid structures (e.g., pillars) that are physically coupled to the surface 69 of the substrate 56. As discussed above, each of the anchoring elements 60 are positioned in a respective recess 72 of the fixed electrodes 58A and 58B.

The supporting elastic elements 62 directly overlie and are spaced from the surface 69 of the substrate 56. The supporting elastic elements 62 physically couple the anchoring elements 60 and the coupling mass 64 to each other. In one embodiment, as shown in FIGS. 3 and 4, the supporting elastic elements 62 are torsional springs. Each of the supporting elastic elements 62 includes a first torsional element 74 and a second torsional element 76.

The first torsional element 74 is physically coupled to the coupling mass 64 and the second torsional element 76. The first torsional element 74 extends substantially in a rectilinear manner along the Y axis, alongside (with respect to the X axis) a respective anchoring element 60.

The second torsional element 76 is physically coupled to the first torsional element 74 and the anchoring element 60. The second torsional element 76 extends substantially in a rectilinear manner along the X axis, alongside (with respect to the Y axis) the respective anchoring element 60.

Each of the first torsional elements 74 and the second torsional elements 76 is a beam of small length, and is configured so as to be free to perform rotations about its own axis (the Y axis and the X axis, respectively) and be rigid in regard to other types of rotations/displacements. Together, the first torsional element 74 and the second torsional element 76 have a configuration and mechanical characteristics such as to define, in a position corresponding to the end they have in common, a point of constraint 80 having a hinge-like operation in which the coupling mass 64 is configured to move along the Z axis, with substantially no movement along the X axis and the Y axis.

The positions of the point of constraints 80 are selected in such a way as to minimize differences between displacements of the fixed electrodes 58A and 58B and of the sensing mass 68 along the Z axis, when any deformation of the substrate 56 occurs. In particular, each of the point of constraints 80 is positioned outside an outline of the fixed electrodes 58A and 58B in the plan view (i.e., the point of constraints 80 do not directly overlie the electrodes 58A and 58B), and is positioned in a respective recess 72 of the fixed electrodes 58A and 58B.

The coupling mass 64 directly overlies and is spaced from the surface 69 of the substrate 56. The coupling mass 64 is physically coupled to the supporting elastic elements 62, more specifically to the first torsional elements 74 of the supporting elastic elements 62. The coupling mass 64 is substantially rectangular in shape in the plan view with a length extending along the X axis and width extending along the Y axis. The coupling mass 64 has a high stiffness to the point that the coupling mass 64 can be considered a plane (extending, at rest, in the XY plane) and undeformable.

The coupling mass 64 includes a body 82, a first end 84, and a second end 86. The body 82 is positioned between the first end 84 and second end 86. The first end 84 and the second end 86 are shaped like a "C" and a "reversed C", respectively. In particular, each of the first end 84 and the second end 86 is formed by two prolongation elements 88 and 90, which project in cantilever fashion from the body 82 above the substrate 56, and define a cavity 92 between them. Each of the first torsional elements 74 of the supporting elastic element 62 is physically coupled to one free end of a respective prolongation element 88 and 90.

The connection elastic elements 66A and 66B directly overlie and are spaced from the surface 69 of the substrate 56. The connection elastic elements 66A and 66B physically couple the coupling mass 64 to the sensing mass 68. Namely, the connection elastic elements 66A and 66B extend from the sensing mass 68 to the body 82 inside the cavities 92.

The connection elastic elements 66A and 66B are configured so as to be compliant to a torsion about their direction of extension (the X axis), thus enabling rotation of the sensing mass 68 out of the XY plane, about an axis of rotation A defined by the connection elastic elements 66A and 66B. In one embodiment, the axis of rotation A passes through a central point O of the Z axis accelerometer 16, and moreover constitutes an axis of symmetry for the coupling mass 64.

The supporting elastic elements 62 have a stiffness much higher than that of the connection elastic elements 66A and 66B, so that it may be considered that the coupling mass 64 will remain substantially still, with respect to the sensing mass 68, in regard to external accelerations along the Z axis.

The sensing mass 68 directly overlies and is spaced from the surface 69 of the substrate 56. The sensing mass 68 is physically coupled to the supporting elastic elements 62. The sensing mass 68 is a mass of conductive material, such as semiconductor material. The sensing mass 68 includes an opening 70.

The opening 70 is a through hole that extends though the sensing mass 68. The anchoring elements 60, the supporting elastic element 62, the coupling mass 64, and the connection elastic elements 66A and 66B are positioned in the opening 70 and spaced away from a sidewall of the opening 70. As discussed above, the fixed electrodes 58A and 58B are positioned on opposite sides of an opening 70 of the sensing mass 68, and directly underlie the sensing mass 68.

Due to the structural arrangement of the Z axis accelerometer 16, the sensing mass 68, following upon deformations of the substrate 56, displaces along the Z axis in a way substantially corresponding to displacements of the fixed electrodes 58A and 58B at the points of constraint 80 so as to minimize the variations of the relative gap between the same sensing mass 68 and the fixed electrodes 58A and 58B.

During operation, the sensing mass 68 and the fixed electrodes 58A and 58B are biased at respective biasing voltages. As a result, the sensing mass 68 is capacitively coupled to the fixed electrodes 58A and 58B.

In the rest condition (i.e., when no external acceleration is applied to the Z axis accelerometer 16), distances between the sensing mass 68 and each of the fixed electrodes 58A and 58B are equal. As a result, capacitances between the sensing mass 68 and each of the fixed electrodes 58A and 58B are equal.

In response to an external acceleration being applied to the Z axis accelerometer 16, the sensing mass 68 turns, by the inertial effect, about the axis of rotation A, so as to approach one of the two fixed electrodes 58A and 58B (e.g., the fixed electrode 58A) and to correspondingly move away from the other of the two fixed electrodes 58A and 58B (e.g., the fixed electrode 58B). As a result, the capacitance between the sensing mass 68 and the fixed electrode 58A is no longer equal to the capacitance between the sensing mass 68 and the fixed electrode 58B. Acceleration is measured based on variations between the capacitance of the sensing mass 68 and the fixed electrode 58A and the capacitance of the sensing mass 68 and the fixed electrode 58B.

In order for the X axis accelerometer 12, the Y axis accelerometer 14, and the Z axis accelerometer 16 to be used for both the user interface mode and the TWS mode, the accelerometers are fabricated to have a large bandwidth, low product noise density, and high signal accuracy. In one embodiment, each of the X axis accelerometer 12, the Y axis accelerometer 14, and the Z axis accelerometer 16 has a bandwidth between 0.8 and 1.2 kilohertz (kHz), a power noise density between 28 and 32 micro-g per square root hertz ($\mu g/\sqrt{Hz}$), and a signal accuracy of within 170 and 190 milli-g (mg).

The device 10 is fabricated with specific electromechanical parameters for each axis to achieve the large bandwidth, the low product noise density, and the high signal accuracy. Namely, each of the X axis accelerometer 12, the Y axis accelerometer 14, and the Z axis accelerometer 16 is fabricated with a specific mass, stiffness, active capacitance, and bonding pressure.

In one embodiment, the X axis accelerometer 12 includes a sensing mass having a mass between 12 and 13 nanokilogram (nkg) or microgram (μg), includes springs having a stiffness (e.g., a total stiffness of the springs) between 1.5 and 6.3 Newton per meter (N/m), has an active capacitance between 250 and 450 femtofarad (fF), and is bonded to a supporting substrate with a bonding pressure between 13 and 17 millibar (mbar).

The mass of the sensing mass of the X axis accelerometer 12 is realized by, for example, the size or footprint of the sensing mass. In one embodiment, the width of the sensing mass (e.g., width W1 of the sensing mass 28 of FIG. 2) is between 470 and 490 micrometers (μm), and the length of the sensing mass (e.g., length L1 of the sensing mass 28 of FIG. 2) is between 530 and 540 μm. For example, in some cases, the width of the sensing mass is between 479 and 481 μm, and the length of the sensing mass is between 539 and 541 μm.

The stiffness of springs of the X axis accelerometer 12 is realized by, for example, the dimensions and number of folds of the springs. In one embodiment, each of the springs (e.g., the spring elements 26 of FIG. 2) is a folded type spring having 3 to 5 folds. In one embodiment, each fold of the springs has a width (e.g., width W2 of the spring elements 26 of FIG. 2) between 2.2 and 2.6 μm, and a length (e.g., length L2 of the spring elements 26 of FIG. 2) between 180 and 200 μm. For example, in some cases, each of the springs has a width between 2.3 and 2.5 μm, and a length between 189 and 191 μm.

The active capacitance of the X axis accelerometer 12 is realized by, for example, the dimensions and gap of the electrodes of the X axis accelerometer 12. In one embodiment, each of the electrodes (e.g., the first electrodes 32 and the second electrodes 34 of FIG. 2) has a thickness (e.g., thickness of the first electrodes 32 and the second electrodes 34 along the Z axis in FIG. 2) between 20 and 30 μm, and a length (e.g., a total length L3 of the first electrodes 32 and the second electrodes 34 of FIG. 2) between 100 and 120 μm. For example, in some cases, each of the electrodes has a width between 24 and 26 µm, and a length between 109 and 111 µm. In one embodiment, the electrodes are spaced from the sensing mass of the X axis accelerometer 12 is by a distance between 1.8 and 2 µm (e.g., referring to FIG. 2, the electrode 48 of the first electrodes 32 is spaced horizontally from the arm 50 of the intermediate arms 42 by a distance between 1.8 and 2 µm, and the electrode 52 of the second electrodes 34 is spaced horizontally from the arm 54 of the intermediate arms 42 by a distance between 1.8 and 2 µm).

The bonding pressure of the X axis accelerometer 12 is realized by, for example, utilizing specific techniques for bonding the X axis accelerometer 12 to a supporting substrate. In one embodiment, the X axis accelerometer 12 is bonded using a gas mixture of 2% argon (Ar) and 98% nitrogen ($N_2$) with getter integration.

As a result of the specific mass, stiffness, the active capacitance, and bonding pressure of the X axis accelerometer 12 discussed above, the X axis accelerometer 12 has a resonance frequency, quality factor, sensitivity, and Brownian noise density that are suitable for both the user interface mode and the TWS mode. In one embodiment, the X axis accelerometer 12 has a resonance frequency between 2 and 3.6 kHz, a quality factor between 3 and 7, a sensitivity between 10 and 12 fF/g, and a Brownian noise density between 5 and 9 µg/√Hz The Y axis accelerometer 14 is fabricated with the same electromechanical parameters as the X axis accelerometer 12. In one embodiment, the Y axis accelerometer 14 includes a sensing mass having a mass between 12 and 13 nkg, includes springs having a stiffness between 1.5 and 6.3 N/m, has an active capacitance between 250 and 450 fF, and is bonded to a substrate with a bonding pressure between 13 and 17 mbar.

Similar to the X axis accelerometer 12, the mass of the sensing mass of the Y axis accelerometer 14 is realized by, for example, the size or footprint of the sensing mass. In one embodiment, the width of the sensing mass (e.g., width W1 of the sensing mass 28 of FIG. 2) is between 470 and 490 micrometers (µm), and the length of the sensing mass (e.g., length L1 of the sensing mass 28 of FIG. 2) is between 530 and 540 µm. For example, in some cases, the width of the sensing mass is between 479 and 481 µm, and the length of the sensing mass is between 539 and 541 µm.

The stiffness of springs of the Y axis accelerometer 14 is realized by, for example, the dimensions and number of folds of the springs. In one embodiment, each of the springs (e.g., the spring elements 26 of FIG. 2) is a folded type spring having 3 to 5 folds. In one embodiment, each fold of the springs has a width (e.g., width W2 of the spring elements 26 of FIG. 2) between 2.2 and 2.6 µm, and a length (e.g., length L2 of the spring elements 26 of FIG. 2) between 180 and 200 µm. For example, in some cases, each of the springs has a width between 2.3 and 2.5 µm, and a length between 189 and 191 µm.

The active capacitance of the Y axis accelerometer 14 is realized by, for example, the dimensions and gap of the electrodes (e.g., the first electrodes 32 and the second electrodes 34 of FIG. 2) of the Y axis accelerometer 14. In one embodiment, each of the electrodes has a thickness (e.g., thickness of the first electrodes 32 and the second electrodes 34 along the Z axis in FIG. 2) between 20 and 30 µm, and a length (e.g., a total length L3 of the first electrodes 32 and the second electrodes 34 of FIG. 2) between 100 and 120 µm. For example, in some cases, each of the electrodes has a width between 24 and 26 µm, and a length between 109 and 111 µm. In one embodiment, the electrodes are spaced from the sensing mass of the Y axis accelerometer 14 is by a distance between 1.8 and 2 µm (e.g., referring to FIG. 2, the electrode 48 of the first electrodes 32 is spaced horizontally from the arm 50 of the intermediate arms 42 by a distance between 1.8 and 2 µm, and the electrode 52 of the second electrodes 34 is spaced horizontally from the arm 54 of the intermediate arms 42 by a distance between 1.8 and 2 µm).

The bonding pressure of the Y axis accelerometer 14 is realized by, for example, utilizing specific techniques for bonding the Y axis accelerometer 14 to a supporting substrate. In one embodiment, the Y axis accelerometer 14 is bonded using a gas mixture of 2% argon (Ar) and 98% nitrogen ($N_2$) with getter integration.

As a result of the specific mass, stiffness, the active capacitance, and bonding pressure of the Y axis accelerometer 14 discussed above, the Y axis accelerometer 14 has a resonance frequency, quality factor, sensitivity, and Brownian noise density that are suitable for both the user interface mode and the TWS mode. In one embodiment, the Y axis accelerometer 14 has a resonance frequency between 2 and 3.6 kHz, a quality factor between 3 and 7, a sensitivity between 10 and 12 fF/g, and a Brownian noise density between 5 and 9 µg/√Hz.

In one embodiment, the Z axis accelerometer 16 includes a sensing mass having a mass between 24 and 28 nkg, includes springs having a stiffness between 170e-9 and 370e-9 N/m, has an active capacitance between 330 and 570 fF, and is bonded to a substrate with a bonding pressure between 13 and 17 mbar.

The mass of the sensing mass of the Z axis accelerometer 16 is realized by, for example, the size or footprint of sensing mass. In one embodiment, the width of the sensing mass (e.g., width W4 of the sensing mass 68 of FIGS. 3 and 4) is between 570 and 590 µm, and the length of the sensing mass (e.g., length L4 of the sensing mass 68 of FIGS. 3 and 4) is between 950 and 1050 µm. For example, in some cases, the width of the sensing mass is between 579 and 581 µm, and the length of the sensing mass is between 999 and 1001 µm. In one embodiment, a distance between a center of mass of the Z axis accelerometer 16 and a tilting axis of the sensing mass of the Z axis accelerometer 16 (e.g., the axis of rotation A in FIG. 3) is between 150 and 170 µm. For example, in some cases, the distance between a center of mass of the Z axis accelerometer 16 and a tilting axis of the sensing mass of the Z axis accelerometer is between 159 and 171 µm.

The stiffness of the springs of the Z axis accelerometer 16 is realized by, for example, the dimensions of the springs. In one embodiment, each of the springs (e.g., the supporting elastic elements 62 and the connection elastic elements 66A and 66B in FIGS. 3 and 4) is a torsional spring having a width (e.g., width W5 in FIG. 3) between 3.8 and 4.2 µm, and a length (e.g., length L5 in FIG. 3) between 250 and 270 µm. For example, in some cases, each of the springs is a torsional spring having a width between 3.9 and 4.1 µm, and a length between 259 and 261 µm.

The active capacitance of the Z axis accelerometer 16 is realized by, for example, the area and gap between the electrodes of the Z axis accelerometer 16. In one embodiment, each of the electrodes (e.g., the fixed electrodes 58A and 58B) of the Z axis accelerometer 16 has an area between 65e3 and 67e3 µm². In one embodiment, the electrodes are spaced from the sensing mass by a distance between 1 and 1.2 µm (e.g., referring to FIG. 4, each of the fixed electrodes 58A and 58B is spaced vertically along the Z axis from the sensing mass 68 by a distance between 1 and 1.2 µm).

The bonding pressure of the Z axis accelerometer 16 is realized by, for example, utilizing specific techniques for bonding the Z axis accelerometer 16 to a supporting substrate. In one embodiment, the Z axis accelerometer 16 is bonded using a gas mixture of 2% argon (Ar) and 98% nitrogen (N$_2$) with getter integration.

As a result of the specific mass, stiffness, the active capacitance, and bonding pressure of the Z axis accelerometer 16 discussed above, the Z axis accelerometer 16 has a resonance frequency, quality factor, sensitivity, and Brownian noise density that are suitable for both the user interface mode and the TWS mode. In one embodiment, the Z axis accelerometer 16 has a resonance frequency between 1.9 and 2.6 kHz, a quality factor between 1.5 and 4, a sensitivity between 6 and 16 fF/g, and a Brownian noise density between 7 and 11 μg/√Hz.

The various embodiments disclosed herein provide MEMS accelerometers that are configured for a user interface mode and a TWS mode of an audio device. The accelerometers are fabricated with specific electromechanical parameters, such as mass, stiffness, active capacitance, and bonding pressure. As a result of the specific mass, stiffness, the active capacitance, and bonding pressure, the accelerometers have a resonance frequency, quality factor, sensitivity, and Brownian noise density that are suitable for both the user interface mode and the TWS mode.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An accelerometer, comprising:
a substrate having a surface;
a sensing mass overlying the surface of the substrate, the sensing mass configured to move in a direction extending along the surface of the substrate, the sensing mass having a mass between 12 and 13 microgram;
a plurality of electrodes on the surface of the substrate, the plurality of electrodes configured to be capacitively coupled to the sensing mass with an active capacitance between 250 and 450 femtofarad; and
a plurality of folded springs that couple the sensing mass to the substrate, the plurality of folded springs having a stiffness between 1.5 and 6.3 Newton/meter.

2. The accelerometer of claim 1 wherein the accelerometer is bonded to a supporting substrate with a bonding pressure between 13 and 17 millibar.

3. The accelerometer of claim 2 wherein the accelerometer is bonded using a gas mixture of 2% argon (Ar) and 98% nitrogen (N$_2$).

4. The accelerometer of claim 1 wherein the sensing mass has a width between 470 and 490 micrometers, and a length between 530 and 540 micrometers.

5. The accelerometer of claim 1 wherein
each of the plurality of folded springs includes 3 to 5 folds, and
each of the folds has a width between 2.2 and 2.6 micrometers, and has a length between 180 and 200 micrometers.

6. The accelerometer of claim 1 wherein each of the plurality of electrodes has a thickness between 20 and 30 micrometers, has a length between 100 and 120 micrometers, and is spaced from the sensing mass by a distance between 1.8 and 2 micrometers.

7. The accelerometer of claim 1 wherein the accelerometer has a bandwidth between 0.8 and 1.2 kilohertz, a power noise density between 28 and 32 micro-g/square root hertz (μg/√Hz), and a signal accuracy of within 170 and 190 milli-g.

8. The accelerometer of claim 1 wherein the accelerometer has a resonance frequency between 2 and 3.6 kilohertz, a quality factor between 3 and 7, a sensitivity between 10 and 12 femtofarad/g, and a Brownian noise density between 5 and 9 micro-g/square root hertz (μg/√Hz).

9. An accelerometer, comprising:
a substrate having a surface extending in a first direction and a second direction;
a sensing mass overlying the surface of the substrate, the sensing mass configured to move in a third direction transverse to the first and second directions, the sensing mass having a mass between 24 and 28 microgram;
a plurality of electrodes on the surface of the substrate, the plurality of electrodes configured to be capacitively coupled to the sensing mass with an active capacitance between 330 and 570 femtofarad; and
a plurality of torsional springs that couple the sensing mass to the substrate, the plurality of torsional springs having a stiffness between 170e-9 and 370e-9 Newton/meter.

10. The accelerometer of claim 9 wherein the accelerometer is bonded to a supporting substrate with a bonding pressure between 13 and 17 millibar.

11. The accelerometer of claim 10 wherein the accelerometer is bonded using a gas mixture of 2% argon (Ar) and 98% nitrogen (N$_2$).

12. The accelerometer of claim 9 wherein
the sensing mass has a width between 570 and 590 micrometers, and a length between 950 and 1050 micrometers, and
the sensing mass has a center of mass and a tilting axis that are spaced from each other by a distance between 150 and 170 micrometers.

13. The accelerometer of claim 9 wherein each of the plurality of torsional springs has a width between 3.8 and 4.2 micrometers, and a length between 250 and 270 micrometers.

14. The accelerometer of claim 9 wherein each of the plurality of electrodes has an area between 65e3 and 67e3 micrometer$^2$, and is spaced from the sensing mass by a distance between 1 and 1.2 micrometers.

15. The accelerometer of claim 9 wherein the accelerometer has a bandwidth between 0.8 and 1.2 kilohertz, a power noise density between 28 and 32 micro-g/square root hertz (μg/√Hz), and a signal accuracy of within 170 and 190 milli-g.

16. The accelerometer of claim 9 wherein the accelerometer has a resonance frequency between 1.9 and 2.6 kilohertz, a quality factor between 1.5 and 4, a sensitivity between 6 and 16 femtofarad/g, and a Brownian noise density between 7 and 11 micro-g/square root hertz (μg/√Hz).

17. A device, comprising:
a substrate;
first and second accelerometers, each of the first and second accelerometers including:

a first sensing mass overlying the substrate, the first sensing mass configured to move in a first direction, the first sensing mass having a mass between 12 and 13 microgram;

a first plurality of electrodes on the substrate, the first plurality of electrodes configured to be capacitively coupled to the first sensing mass with an active capacitance between 250 and 450 femtofarad; and a plurality of folded springs that couple the first sensing mass to the substrate, the plurality of folded springs having a stiffness between 1.5 and 6.3 Newton/meter; and a third accelerometer including:

a second sensing mass overlying the substrate, the second sensing mass configured to move in a second direction transverse to the first direction, the second sensing mass having a mass between 24 and 28 microgram;

a second plurality of electrodes on the substrate, the second plurality of electrodes configured to be capacitively coupled to the second sensing mass with an active capacitance between 330 and 570 femtofarad; and a plurality of torsional springs that couple the second sensing mass to the substrate, each of the plurality of torsional springs having a stiffness between 170e-9 and 370e-9 Newton/meter.

18. The device of claim 17, further comprising:

a processor configured to detect a touch input based on first acceleration measurements generated by the first, second, and third accelerometers, and detect a voice based on second acceleration measurements generated by the first, second, and third accelerometers.

19. The device of claim 17 wherein the first sensing mass has a width between 470 and 490 micrometers, and a length between 530 and 540 micrometers, each of the plurality of folded springs includes 3 to 5 folds, each of the folds has a width between 2.2 and 2.6 micrometers, and has a length between 180 and 200 micrometers, and each of the first plurality of electrodes has a thickness between 20 and 30 micrometers, has a length between 100 and 120 micrometers, and is spaced from the first sensing mass by a distance between 1.8 and 2 micrometers.

20. The device of claim 17 wherein the second sensing mass has a width between 570 and 590 micrometers, and a length between 950 and 1050 micrometers, each of the plurality of torsional springs has a width between 3.8 and 4.2 micrometers, and a length between 250 and 270 micrometers, and each of the second plurality of electrodes has an area between 65e3 and 67e3 micrometer$^2$, and is spaced from the second sensing mass by a distance between 1 and 1.2 micrometers.

* * * * *